(12) United States Patent
Liou et al.

(10) Patent No.: US 9,030,199 B2
(45) Date of Patent: May 12, 2015

(54) MAGNETORESISTANCE SENSOR AND FABRICATING METHOD THEREOF

(75) Inventors: Fu-Tai Liou, Hsinchu County (TW); Chien-Min Lee, Hsinchu County (TW)

(73) Assignee: Voltafield Technology Corporation, Hsinchu County (TW)

( * ) Notice: Subject to any disclaimer, the term of this patent is extended or adjusted under 35 U.S.C. 154(b) by 281 days.

(21) Appl. No.: 13/082,825

(22) Filed: Apr. 8, 2011

(65) Prior Publication Data
US 2012/0169330 A1    Jul. 5, 2012

(30) Foreign Application Priority Data
Dec. 31, 2010 (TW) .............................. 99147343 A

(51) Int. Cl.
G01R 33/02 (2006.01)
H05K 3/42 (2006.01)
H05K 3/46 (2006.01)
G01R 33/09 (2006.01)
B82Y 25/00 (2011.01)
G01D 5/16 (2006.01)
G01R 33/06 (2006.01)

(52) U.S. Cl.
CPC ............... G01R 33/093 (2013.01); *G01D 5/16* (2013.01); *G01R 33/09* (2013.01); *G01R 33/06* (2013.01); B82Y 25/00 (2013.01)

(58) Field of Classification Search
CPC ................................. G01R 33/09; B82Y 25/00
USPC ................... 324/252, 207.21; 257/E27.006; 338/32 R
See application file for complete search history.

(56) References Cited

U.S. PATENT DOCUMENTS

| 5,521,501 | A | 5/1996 | Dettmann et al. |
| 6,048,739 | A * | 4/2000 | Hurst et al. ........................ 438/3 |
| 7,037,604 | B2 * | 5/2006 | Witcraft ........................ 428/816 |
| 7,084,024 | B2 * | 8/2006 | Gluschenkov et al. ........ 438/199 |
| 7,306,954 | B2 * | 12/2007 | Nejad et al. ........................ 438/3 |
| 2005/0023581 | A1 * | 2/2005 | Nuetzel et al. ................. 257/295 |
| 2006/0202291 | A1 * | 9/2006 | Kolb et al. ...................... 257/421 |
| 2006/0202692 | A1 | 9/2006 | Tatschl et al. |
| 2006/0209591 | A1 * | 9/2006 | Hong et al. .................... 365/173 |
| 2007/0200565 | A1 * | 8/2007 | Witcraft et al. ................ 324/252 |
| 2007/0253120 | A1 * | 11/2007 | Saito et al. ............... 360/324.11 |
| 2009/0128282 | A1 * | 5/2009 | Zimmer et al. .............. 338/32 R |

* cited by examiner

*Primary Examiner* — Patrick Assouad
*Assistant Examiner* — Hoang X Nguyen
(74) *Attorney, Agent, or Firm* — Alan D. Kamrath; Kamrath IP Lawfirm, P.A.

(57) ABSTRACT

An apparatus of a magnetoresistance sensor consisting of a substrate, a conductive unit on the substrate, and a magnetoresistance structure on the conductive unit is provided. The conductive unit includes a first surface and a second surface opposite to each other, and the first surface faces the substrate. The magnetoresistance structure is formed on the second surface of the conductive unit and is electrically connected to the conductive unit. The magnetoresistance sensor has high performance and reliability. A magnetoresistance sensor fabricating method based on this apparatus is also provided.

23 Claims, 3 Drawing Sheets

MAGNETORESISTANCE SENSOR AND FABRICATING METHOD THEREOF

FIELD OF THE INVENTION

The present invention relates to a magnetoresistance sensor and a fabricating method thereof, and particularly to a magnetoresistance sensor with high reliability and a fabricating method thereof.

BACKGROUND OF THE INVENTION

With the development of consumer electronic products such as mobile phones and electronic compasses, additionally together with conventional products such as motors and brakes, the demand of magnetoresistance sensors is progressively increasing.

Typically, a magnetoresistance sensor includes a substrate, a magnetoresistance structure formed on the substrate and at least one conductive layer formed on the magnetoresistance structure, and in a conventional process for fabricating the magnetoresistance sensor, the magnetoresistance structure is firstly formed prior to the metallization process for forming the magnetoresistance structure. Such processing sequence leaves a high risk of cross contamination either to the backend equipments or front-end devices (in the substrate) due to the outward diffusion of the magnetic elements (for example iron, cobalt and nickel) in the magnetoresistance structure. The other concern of the conventional processes arises from thermal and stress accumulation contributed from the subsequent metallization processes, such as forming the conductive layer. The performance and reliability of the magnetoresistance structure may also get worse under such circumstances.

SUMMARY OF THE INVENTION

The present invention provides a magnetoresistance sensor with excellent performance and high reliability.

The present invention also provides a fabricating method of a magnetoresistance sensor, by which the performance and reliability of the magnetoresistance sensor can be improved.

The present invention provides a magnetoresistance sensor, which includes a substrate, a conductive unit and a magnetoresistance structure. The conductive unit is configured on the substrate. The conductive unit layer includes a plurality of routing conductive traces, and has a first surface and a second surface on an opposite side of the conductive layer to the first surface. The first surface faces the substrate. The magnetoresistance structure is configured on the second surface of the conductive unit and electrically connected to the conductive unit.

The present invention also provides a fabricating method of a magnetoresistance sensor. The method includes providing a substrate, forming a conductive unit on the substrate, and forming a magnetoresistance structure on the conductive unit. The conductive unit includes a plurality of routing conductive traces, and has a first surface and a second surface on an opposite side of the conductive unit to the first surface. The first surface faces the substrate. The magnetoresistance structure is formed on the second surface of the conductive unit, and is electrically connected to the conductive unit.

In the magnetoresistance sensor of the present invention, the magnetoresistance structure is formed after forming the conductive unit. Following such sequence, the contamination risk to backend equipments or front-end devices can be prevented, which is due to the outward diffusion of magnetic elements such as iron, cobalt and nickel used in the magnetoresistance structure. Furthermore, the performance and reliability of the magnetoresistance structures will not be deteriorated in the absence of thermal cycles and stress accumulation induced in the metallization process of forming the conductive unit.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
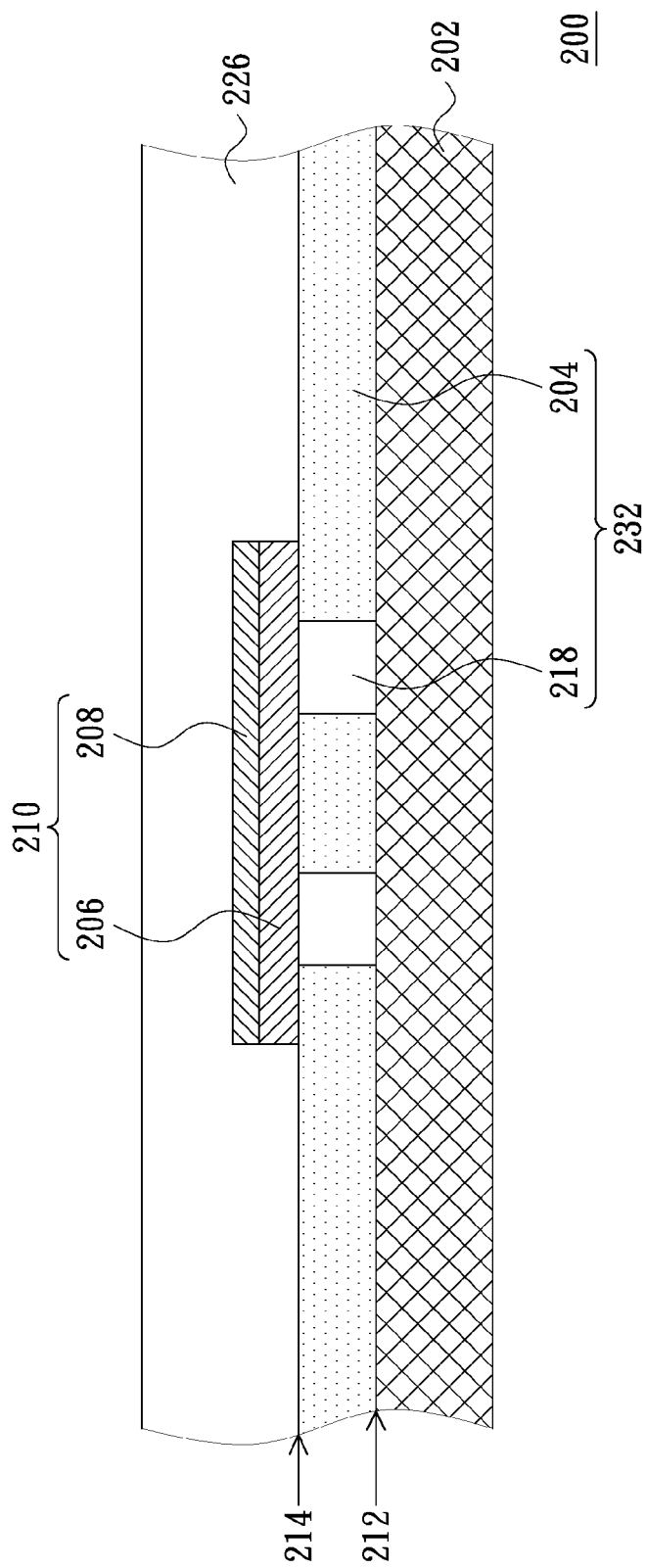
FIG. 1 is a cross-sectional, schematic view of a magnetoresistance sensor in accordance with an embodiment of the present invention.

FIG. 1 is a cross-sectional, schematic view of a magnetoresistance sensor in accordance with an embodiment of the present invention. Referring to FIG. 1, a magnetoresistance sensor 200 includes a substrate 202, a conductive unit 232 and a magnetoresistance structure 210. The substrate 202 can be either a silicon substrate covered by a dielectric material or a silicon chip having previously formed logic circuits. The conductive unit 232 is configured on the substrate 202. The conductive unit 232 includes a plurality of routing conductive traces, and has a first dielectric layer 218 formed on the substrate 202 and a first conductive layer 204 configured in the first dielectric layer 218. In the present embodiment, the first conductive layer 204 constitutes the routing conductive traces. The first conductive layer 204 is electrically connected to the magnetoresistance structure 210. A material of the first conductive layer 204 can be either tungsten or copper.

The conductive unit 232 has a first surface 212 and a second surface 214 on an opposite side of the conductive unit 232 to the first surface 212. The first surface 212 faces the substrate 202. The magnetoresistance structure 210 is configured on the second surface 214 of the conductive unit 232 and is electrically connected to the conductive unit 232. In detail, the magnetoresistance structure 210 includes a magnetoresistance layer 206 and a hard mask layer 208. The magnetoresistance layer 206 is configured on the second surface 214 of the conductive unit 232, and the hard mask layer 208 is configured on a surface of the magnetoresistance layer 206. A passive protecting layer 226 is formed on the hard mask layer 208 to protect the magnetoresistance structure 210. Generally, the magnetoresistance layer 206 is based on the mechanisms including anisotropic magnetoresistance (AMR), giant magnetoresistance (GMR), tunneling magnetoresistance (TMR), or combination thereof. A material of the magnetoresistance layer 206 can be, but not limited to, ferromagnets, antiferromagnets, ferrimagnets, paramagnetic or diamagnetic metals, tunneling oxides, or combination thereof.

In the present embodiment, after a general semiconductor element or other circuit element (i.e. the conductive unit 232) is formed on the substrate 202, the magnetoresistance structure 210 is formed on the conductive unit 232. Therefore, the magnetic materials such as iron, cobalt and nickel in the magnetoresistance structure 210 will not contaminate the machines used in the subsequent processes. Further, the thermal cycles and stress accumulation in the subsequent metallization processes especially lithography and etching will not affect the performance and reliability of the magnetoresistance structure 210.

Additionally, in the present embodiment, the conductive unit 232 is configured on the substrate 202 and then the magnetoresistance structure 210 is formed on the conductive unit 232. Here the hard mask layer 208 of the magnetoresistance structure 210 is only used for defining the magnetoresistance layer 206 and does not serve as electrical contact to the conductive unit 232. Thus the hard mask layer 208 can be electrically conductive, semi-conductive or non-conductive, and can be made of conductors, semiconductors or non-conductors. Further, when the hard mask layer 208 is electrically conductive, taking the material of the hard mask layer 208 is tantalum (Ta) or tantalum nitride (TaN) as an example, it is not necessary for the hard mask layer 208 to have a conventional function of preventing over-etching to the magnetoresistance layer 206 during forming the conductive unit 232. Therefore, a thickness of the conductive hard mask layer 208, for example, can be decreased to be in a range from 100 to 150 angstroms (Å). The thickness of the hard mask layer 208 is less than the thickness of the hard mask layer in the conventional magnetoresistance structure, which is in a range from 300 to 400 angstroms. In addition, the resistance of the hard mask layer 208 can also be higher than the resistance of the magnetoresistance layer 206. Less hard mask thickness results in higher resistance, which helps to reduce current shunting effect through the hard mask layer 208 and therefore improves the magnetoresistance ratio. Accordingly, the magnetoresistance layer 206 cooperated with the thinner hard mask layer 208, can improve the sensitivity of magnetic field detection.

In the following embodiments, the material, structure, and process of elements having same reference numerals are identical or similar to that of the aforementioned embodiment, and will not be described here.

Figure 2:
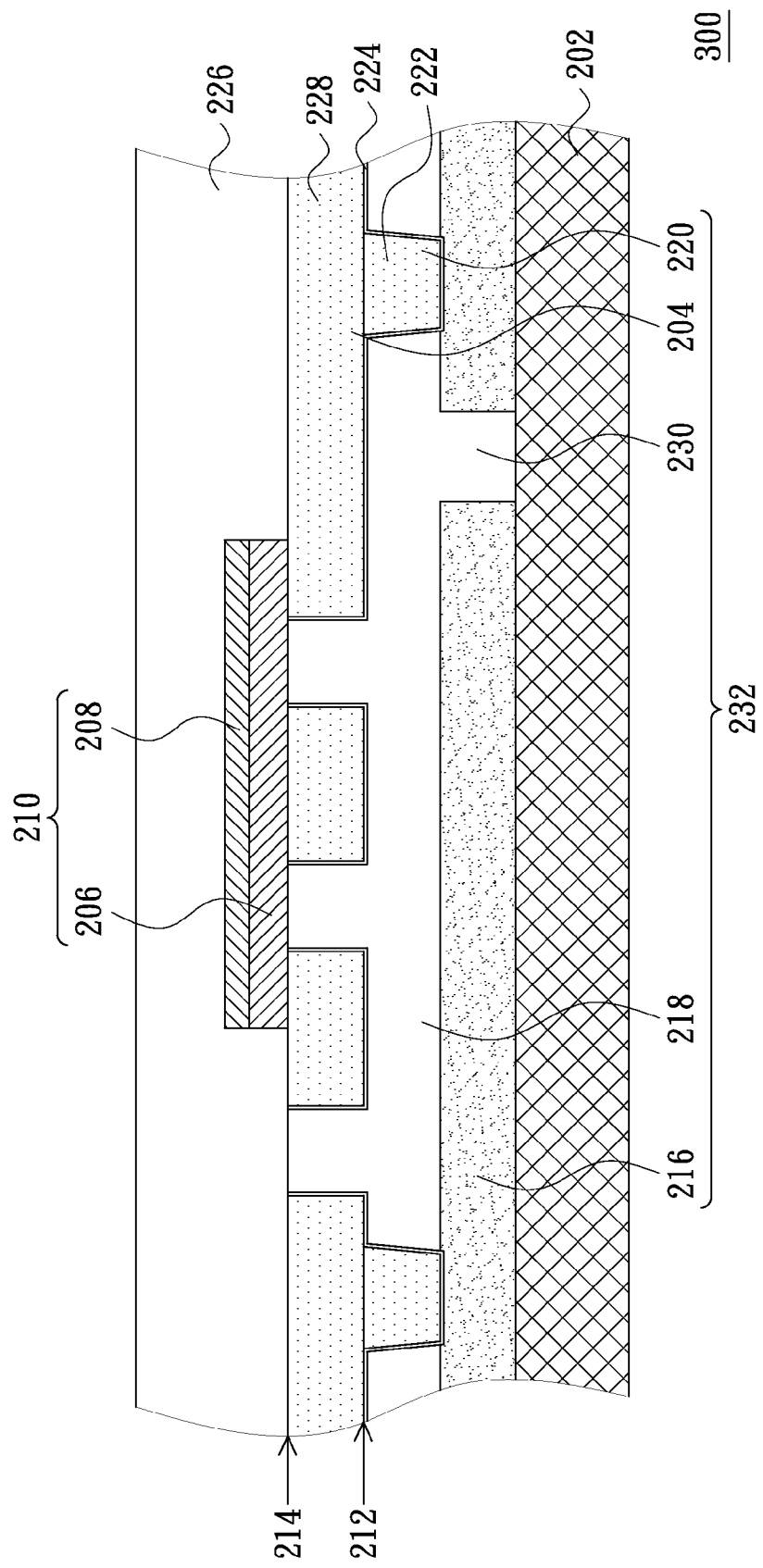
FIG. 2 is a cross-sectional, schematic view of a magnetoresistance sensor in accordance with another embodiment of the present invention.

FIG. 2 is a cross-sectional, schematic view of a magnetoresistance sensor in accordance with another embodiment of the present invention. Referring to FIG. 2, in the present embodiment, to improve the functionality of the magnetoresistance sensor, a magnetoresistance sensor 300 includes a number of conductive layers. The magnetoresistance sensor 300 includes a substrate 202, a conductive unit 232, a magnetoresistance structure 210 and a via contact 220. The conductive unit 232 is configured on the substrate 202. The conductive unit 232 includes a plurality of routing conductive traces. In the present embodiment, the conductive unit 232 includes a second dielectric layer 230 formed on the substrate 202 and a second conductive layer 216 configured in the second dielectric layer 230. Further, a first dielectric layer 218 is formed on the second conductive layer 216, a first conductive layer 204 is configured in the first dielectric layer 218. The via contact 220 is configured in the first dielectric layer 218 and is electrically connected to the first conductive layer 204 and the second conductive layer 216. In the present embodiment, the first conductive layer 204 and the second conductive layer 216 constitute the routing conductive traces. The conductive unit 232 includes the uppermost conductive layer (i.e., the first conductive layer 204).

Usually, the first conductive layer 204 is configured for sensing a resistance change of the magnetoresistance structure 210 in response to a magnetic field variation. The second conductive layer 216 serves as a programming line and is configured for changing or controlling the magnetization direction of the magnetoresistance layer 206. The first dielectric layer 218 and the second dielectric layer 230 can be a dielectric material of either silicon dioxide or silicon nitride. A material of the first conductive unit 204 can be either tungsten or copper, and a material of the second conductive unit 216 can be either aluminum or copper.

The conductive unit 232 has the first surface 212 and the second surface 214 on an opposite side of the conductive unit 232 to the first surface 212. The first surface 212 faces the substrate 202. A magnetoresistance structure 210 is configured on the second surface 214 of the conductive unit 232 and is electrically connected to the conductive unit 232. The magnetoresistance structure 210 includes a magnetoresistance layer 206 and a hard mask layer 208. The hard mask layer 208 is configured on a surface of the magnetoresistance layer 206 to define the magnetoresistance layer 206, and is covered by a passive protecting layer 226 to protect the magnetoresistance structure 210.

In the present embodiment, other conductive layers are not disposed on the magnetoresistance structure 210, and two conductive layers under the magnetoresistance structure 210 are illustrated as an example. However, the number of the conductive layer is not limited by the present embodiment. That is, more than two conductive layers can be sequentially formed under the magnetoresistance layer 206.

Figure 3:
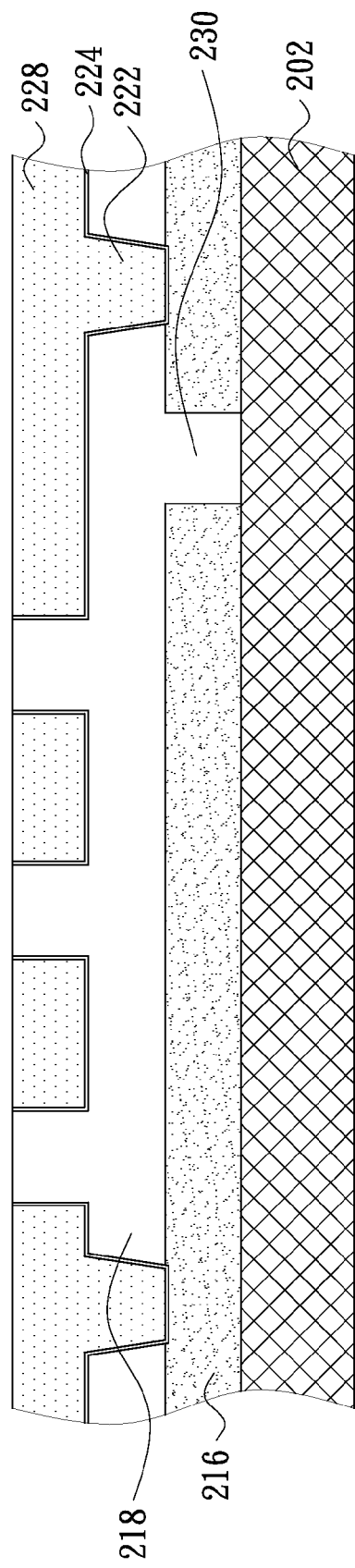
FIG. 3 is a cross-sectional, schematic view illustrating a partial process flow of a fabricating method of a magnetoresistance sensor process in accordance with an embodiment of the present invention.

A fabricating method of the magnetoresistance sensors shown in FIGS. 2, 3 is described as follows.

By using the fabricating method, the magnetic materials such as iron, cobalt and nickel in the magnetoresistance structure 210 will not contaminate the machines used in the subsequent processes. The performance and reliability of previously formed front-end devices (i.e. logic circuits) will not be affected. Further, the thermal cycles and stress accumulation in the subsequent metallization processes especially lithography and etching will not affect the performance and reliability of the magnetoresistance structure 210. Referring to FIG. 2, in the present embodiment, the substrate 202 is provided, and then the conductive unit 232 is formed on the substrate 202. The step of forming the conductive unit 232 includes forming the first dielectric layer 218 on the substrate 202 and forming the first conductive layer 204 in the first dielectric layer 218. The first conductive layer 204 is configured for being electrically connected to the magnetoresistance structure 210. The first dielectric layer 218 can be a dielectric material such as silicon oxide or silicon nitride, and the material of the first conductive layer 204 can be either tungsten or copper.

The conductive unit 232 has the first surface 212 and the second surface 214 on an opposite side of the conductive unit 232 to the first surface 212. The first surface 212 faces the substrate 202. The magnetoresistance structure 210 is formed on the second surface 214 of the conductive unit 232, and is electrically connected to the conductive unit 232. The step of forming the magnetoresistance structure 210 includes forming the hard mask layer 208 on the surface of the magnetoresistance layer 206, and then forming the magnetoresistance layer 206 on the second surface 214 of the conductive unit 232. Before forming the magnetoresistance structure 210, a planarization step of the second surface 214 of the conductive unit 232 can be performed. In addition, the passive protecting layer 226 can be formed to cover and protect the magnetoresistance structure 210. In general, the magnetoresistance layer 206 is based on the mechanisms including anisotropic magnetoresistance (AMR), giant magnetoresistance (GMR), tunneling magnetoresistance (TMR), or combination thereof. The material of the magnetoresistance layer 206 can be, but not limited to, ferromagnets, antiferromagnets, ferrimagnets, paramagnetic or diamagnetic metals, tunneling oxides or combination thereof.

Additionally, in the present embodiment, after the conductive unit 232 is firstly formed on the substrate 202, the magnetoresistance structure 210 is formed on the conductive unit layer 232. Here, the hard mask layer 208 in the magnetoresistance structure 210 is only used for defining the magnetoresistance layer 206 and does not serve as electrical contact to the conductive unit 232. Thus the hard mask layer 208 can be electrically conductive, semi-conductive or non-conductive. Besides, since the position of conductive unit 232 has changed, the hard mask layer 208 no longer serves as an etch-stop layer to prevent over-etching damage to the magnetoresistance layer 206 when forming the conductive unit 232 in the conventional process. Therefore, the thickness of the conductive hard mask layer 208, taking the material thereof is tantalum (Ta) or tantalum nitride (TaN) as an example, can be decreased to be in a range from 100 to 150 angstroms (Å). However, a thickness of the hard mask layer in a conventional magnetoresistance structure is in a range from 300 to 400 angstroms. The thickness of the hard mask layer 208 in the present embodiment is less than the thickness of the hard mask layer in conventional magnetoresistance structure. In addition, the resistance of the hard mask layer 208 can also be higher than the resistance of the magnetoresistance layer 206. It's because less hard mask thickness results in higher resistance, which helps to reduce current shunting effect through hard mask layer 208 and therefore improves the magnetoresistance ratio. Accordingly, the magnetoresistance layer 206 cooperated with the thinner hard mask layer 208, can improve the sensitivity of magnetic field detection.

Considering the functionality and controllability of the magnetoresistance sensors, the magnetoresistance sensor 300 in another embodiment of the present invention utilizes a number of conductive layers. Referring to FIG. 3, the second dielectric layer 230 is formed on the substrate 202, and the second conductive layer 216 is formed in the second dielectric layer 230. The material of the second conductive layer 216 can be either aluminum or copper. Depending on the used material, the sequence of forming the second dielectric layer 230 and forming the second conductive layer 216 can be swapped. Afterwards, the first dielectric layer 218 is formed on the second conductive layer 216. The first dielectric layer 218 and the second dielectric layer 230 can be made of a dielectric material such as silicon oxide or silicon nitride. The first conductive layer 204 and the via contact 220 can be formed together, for example, using a dual damascene process, or separately using twice single damascene processes. In the dual damascene process, the via contact 220 and the first conductive layer 204 can be made of copper or tungsten. In the twice single damascene processes, the via contact 220 can be a tungsten plug and the first conductive layer 204 can be made of copper or tungsten. The purpose of the damascene processes here is to provide a flat and smooth surface to meet the demand of the subsequent formed magnetoresistance layer 206. The flat surface helps to maintain the uniform magnetic domain orientation of the magnetoresistance layer and therefore improve the quality of the magnetoresistance signals.

In the present embodiment, the first conductive layer 204 and the via contact 220 is made of copper and a fabricating process is described as follows. Firstly, the first dielectric layer 218 is etched so as to define at least one via hole 222 connecting the first conductive layer 204 and the second conductive layer 216 in the first dielectric layer 218. Next, the trench 228 above the via hole 222 is defined. The trench 228 is configured for forming the first conductive layer 204. The pattern of the trench 228 fully encloses the pattern of the via hole 222. Next, a barrier layer 224 is formed on surfaces of the via hole 222 and the trench 228 by a physical or chemical vapor deposition method. The barrier layer 224 can be made of either a tantalum nitride (TaN) layer or a titanium nitride (TiN) layer.

After depositing the barrier layer 224, a thin and uniform copper seed layer (not shown) is formed by a vapor deposition method in the trench 228 and the via hole 222 so as to provide nucleating sites for further copper growth. Thus, a mass of copper can be deposited to fill into the via hole 222 and the trench 228 by using electrical plating process. As a result, the via contact 220 and the first conductive layer 204 are formed simultaneously. The via contact 220 can be electrically connected to the first conductive layer 204 and the second conductive layer 206. After that, the redundant copper on the surface is removed using a chemical-mechanical polishing process to achieve a planarization of the second surface 214 of the conductive unit 232.

Thereafter, referring to FIG. 2, the magnetoresistance layer 206 is formed on the planarized second surface 214, using the hard mask layer 208 above for patterning After forming the magnetoresistance structure 210, the magnetoresistance structure 210 can be covered by the passive protecting layer 206 to protect the magnetoresistance structure 210.

The advantage of using copper conductive layer is its low electrical resistivity (~1.7 μΩ-cm), which is only two thirds of that of aluminum (~2.8 μΩ-cm). Thus, when copper conductive layer is used, the parasitic resistance due to metal wiring can be reduced and therefore the signal from the magnetoresistance layer can be improved. In addition, the copper conductive layers have better durability against electromigration, thereby reducing the probability of disconnection of conductive traces and improving the reliability of the magnetoresistance sensors.

In summary, after the conductive unit is configured on the substrate, the magnetoresistance structure is formed on the conductive unit in the present embodiment. Therefore, the hard mask layer in the magnetoresistance structure is only used for defining the magnetoresistance layer and can be either conductive, semi-conductive or non-conductive. That is, it is not necessary for the hard mask layer to serve as the etch-stop layer when etching the conductive unit in the conventional process. Accordingly, the thickness of the hard mask layer in the present embodiment can be less than the thickness of the hard mask layer in the conventional magnetoresistance structure, and the resistance of the hard mask layer can also be much higher than the resistance of the magnetoresistance layer. Higher resistance helps to reduce current shunting effect through hard mask layer and therefore improves the magnetoresistance ratio. As a result, the magnetoresistance layer cooperated with the thinner hard mask layer can improve the sensitivity of magnetic field detection.

Additionally, after the conductive unit is configured on the substrate, the magnetoresistance structure is configured on the conductive unit, the magnetic materials such as iron, cobalt and nickel used in the magnetoresistance structure 210 will not contaminate the machines used in the subsequent processes. The performance and reliability of previously formed front-end devices (i.e. logic circuits) will not be affected. Further, the thermal cycles and stress accumulation in the subsequent metallization processes especially lithography and etching will not affect the performance and reliability of the magnetoresistance structure.

Further, in the present embodiment, the damascene process is used to form the topmost conductive layer. The damascene process provides a flat and smooth surface to meet the demand of subsequent formed magnetoresistance structure. When copper conductive layer is used, one advantage is enhancement of the magnetoresistance signal due to less parasitic resistance. In addition, the copper conductive layer has better durability against electromigration, thereby reducing the probability of disconnection of conductive traces and improving the reliability of the magnetoresistance sensors.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetoresistance sensor, comprising:
   a substrate;
   a conductive unit, configured on the substrate, the conductive unit comprising a plurality of routing conductive traces and an uppermost conductive layer on top of the plurality of routing conductive traces; and
   a magnetoresistance structure, configured on top of the uppermost conductive layer and electrically connected to the conductive unit,
   wherein the magnetoresistance structure comprises a magnetoresistance layer and a hard mask layer on the magnetoresistance layer and a thickness of the hard mask layer is less than a thickness of the magnetoresistance layer and a resistance of the hard mask layer is higher than a resistance of the magnetoresistance layer.

2. The magnetoresistance sensor of claim 1, wherein the conductive unit further comprises:
   a first dielectric layer, configured on the substrate; and
   a first conductive layer, configured in the first dielectric layer and electrically connected to the magnetoresistance structure, the first conductive layer constituting the routing conductive traces.

3. The magnetoresistance sensor of claim 1, wherein the conductive unit further comprises:
   a second dielectric layer, formed on the substrate;
   a second conductive layer, configured in the second dielectric layer;
   a first dielectric layer, formed on the second conductive layer;
   a first conductive layer, configured in the first dielectric layer, the first conductive layer and the second conductive layer constituting the routing conductive traces; and
   a via contact, configured in the first dielectric layer and electrically connected to the first conductive layer and the second conductive layer.

4. The magnetoresistance sensor of claim 3, wherein a material of the first conductive layer is either tungsten or copper formed by using a single or dual damascene process, and a material of the second conductive layer is either aluminum or copper.

5. The magnetoresistance sensor of claim 3, wherein the first dielectric layer and second dielectric layer are made of a dielectric material of either silicon oxide or silicon nitride.

6. The magnetoresistance sensor of claim 1, wherein the substrate is a silicon substrate covered by a dielectric material or a silicon chip having previously formed logic circuits.

7. The magnetoresistance sensor of claim 1, wherein the magnetoresistance structure is based on the mechanism selected from a group consisting of anisotropic magnetoresistance, giant magnetoresistance, tunneling magnetoresistance, and combination thereof.

8. The magnetoresistance sensor of claim 1, wherein a resistance of the magnetoresistance layer changes due to an external magnetic field variation, and a material of the magnetoresistance layer is selected from a group consisting of ferromagnets, antiferromagnets, paramagnetic or diamagnetic metals, tunneling oxides and combination thereof.

9. The magnetoresistance sensor of claim 1, wherein a material of the hard mask layer is selected from a group consisting of conductors, semiconductors, non-conductors, and combination thereof.

10. The magnetoresistance sensor of claim 1, wherein the thickness of the hard mask layer ranges from 100 to 150 Angstroms.

11. A fabricating method of a magnetoresistance sensor, comprising:
    providing a substrate;
    forming a conductive unit on the substrate, the conductive unit comprising a plurality of routing conductive traces and an uppermost conductive layer on top of the plurality of routing conductive traces; and
    forming a magnetoresistance structure on top of the uppermost conductive layer to electrically connect to the conductive unit,
    wherein forming the magnetoresistance structure comprises:
    forming a magnetoresistance layer on the uppermost conductive layer; and
    forming a hard mask layer on the magnetoresistance layer,
    wherein a thickness of the hard mask layer is less than a thickness of the magnetoresistance layer and a resistance of the hard mask layer is higher than a resistance of the magnetoresistance layer.

12. The fabricating method of the magnetoresistance sensor of claim 11, wherein forming the conductive unit comprises:
    forming a first dielectric layer on the substrate; and
    forming a first conductive layer in the first dielectric layer to electrically connect to the magnetoresistance structure, the first conductive layer constituting the routing conductive traces.

13. The fabricating method of the magnetoresistance sensor of claim 11, wherein forming the conductive unit layer comprises:
    forming a second dielectric layer on the substrate;
    forming a second conductive layer in the second dielectric layer;
    forming a first dielectric layer on the second conductive layer;
    forming a first conductive layer in the first dielectric layer, the first conductive layer and the second conductive layer constituting the routing conductive traces; and
    forming a via contact in the first dielectric layer to electrically connect to the first conductive layer and the second conductive layer.

14. The fabricating method of the magnetoresistance sensor of claim 13, wherein a material of the first conductive layer is either tungsten or copper formed by using a single or dual damascene process, and a material of the second conductive layer is either aluminum or copper.

15. The fabricating method of the magnetoresistance sensor of claim 13, wherein the first dielectric layer and second dielectric layer are made of a dielectric material of either silicon oxide or silicon nitride.

16. The fabricating method of the magnetoresistance sensor of claim 13, wherein a material of the via contact is either tungsten or copper.

17. The fabricating method of the magnetoresistance sensor of claim 13, wherein forming the first conductive layer and the via contact comprises a dual damascene process comprising the steps of:
- defining a via hole and a trench in the first dielectric layer;
- forming a barrier layer on surfaces of the through hole and the trench;
- filling the via hole and the trench with a conductive material to form the via contact and the first conductive layer; and
- performing a planarization of the surfaces of the first dielectric layer and the first conductive layer.

18. The fabricating method of the magnetoresistance sensor of claim 11, wherein the substrate is a silicon substrate covered by a dielectric material or a silicon chip having previously formed logic circuits.

19. The fabricating method of a magnetoresistance sensor of claim 11, further comprising performing a planarization of a top the second surface of the conductive unit before forming the magnetoresistance structure.

20. The fabricating method of the magnetoresistance sensor of claim 11, wherein the magnetoresistance structure is based on the mechanism selected from a group consisting of anisotropic magnetoresistance, giant magnetoresistance, tunneling magnetoresistance, and combination thereof.

21. The fabricating method of the magnetoresistance sensor of claim 11, wherein a resistance of the magnetoresistance layer changes due to a variation of an external magnetic field, and a material of the magnetoresistance layer is selected from a group consisting of ferromagnets, antiferromagnets, paramagnetic or diamagnetic metals, tunneling oxides and combination thereof.

22. The fabricating method of the magnetoresistance sensor of claim 11, wherein a material of the hard mask layer is selected from a group consisting of conductors, semiconductors, non-conductors, and combination thereof.

23. The fabricating method of the magnetoresistance sensor of claim 11, wherein the thickness of the hard mask layer ranges from 100 to 150 Angstroms.

* * * * *